(12) United States Patent
Iwamoto et al.

(10) Patent No.: US 10,424,902 B2
(45) Date of Patent: Sep. 24, 2019

(54) IGNITION DEVICE

(71) Applicant: DENSO CORPORATION, Kariya, Aichi-pref. (JP)

(72) Inventors: Fujiyuki Iwamoto, Kariya (JP); Shunichi Takeda, Kariya (JP)

(73) Assignee: DENSO CORPORATION, Kariya (JP)

( * ) Notice: Subject to any disclaimer, the term of this patent is extended or adjusted under 35 U.S.C. 154(b) by 51 days.

(21) Appl. No.: 15/645,155

(22) Filed: Jul. 10, 2017

(65) Prior Publication Data
US 2018/0013266 A1 Jan. 11, 2018

(30) Foreign Application Priority Data
Jul. 11, 2016 (JP) .................. 2016-137092

(51) Int. Cl.
| | |
|---|---|
| *H01T 15/00* | (2006.01) |
| *H01F 38/12* | (2006.01) |
| *H02H 5/04* | (2006.01) |
| *H03K 17/60* | (2006.01) |
| *H03K 17/14* | (2006.01) |
| *F02P 17/12* | (2006.01) |
| *H03K 17/08* | (2006.01) |
| *F02P 9/00* | (2006.01) |

(52) U.S. Cl.
CPC .......... *H01T 15/00* (2013.01); *H01F 38/12* (2013.01); *H02H 5/044* (2013.01); *H03K 17/60* (2013.01); *F02P 9/00* (2013.01); *F02P 17/12* (2013.01); *H03K 17/14* (2013.01); *H03K 17/145* (2013.01); *H03K 2017/0806* (2013.01)

(58) Field of Classification Search
CPC ...... H02H 5/044; H03K 17/14; H03K 17/145; H03K 17/60; H03K 2017/0806; H01T 15/00; H01F 38/12; F02P 17/12; F02P 9/00
USPC ........................................... 123/630
See application file for complete search history.

(56) References Cited

U.S. PATENT DOCUMENTS

| | | | | |
|---|---|---|---|---|
| 4,197,442 A | * | 4/1980 | Carlsson ................ | H02H 5/044 219/710 |
| 4,731,601 A | * | 3/1988 | Nowakowski ........ | F02D 41/064 340/439 |

(Continued)

FOREIGN PATENT DOCUMENTS

| | | |
|---|---|---|
| JP | 5-231291 | 9/1993 |
| JP | 2007-59738 | 3/2007 |
| JP | 2016-12599 | 1/2016 |

*Primary Examiner* — Mahmoud Gimie
*Assistant Examiner* — Joshua Campbell
(74) *Attorney, Agent, or Firm* — Nixon & Vanderhye PC

(57) ABSTRACT

An ignition device capable of more reliably protecting a primary winding of an ignition coil from high temperature is provided. The ignition device includes an ignition coil, a switching element, a temperature sensor, and a thermal cutout circuit. A primary winding of the ignition coil is connected to a DC power supply and the switching element. The temperature sensor is provided to measure the temperature of the switching element. The thermal cutout circuit forcibly turns off the switching element when the temperature of the switching element becomes higher than a predetermined forcible turn-off temperature Toff. The thermal cutout circuit is configured to lower the forcible turn-off temperature Toff when the power supply voltage Vb of the DC power supply decreases.

7 Claims, 18 Drawing Sheets

(56) References Cited

U.S. PATENT DOCUMENTS

| | | | | |
|---|---|---|---|---|
| 5,360,962 | A | * | 11/1994 | Pettit .................... H05B 3/0019 |
| | | | | 219/497 |
| 5,570,004 | A | * | 10/1996 | Shibata .................... G05F 1/56 |
| | | | | 323/274 |
| 5,966,562 | A | * | 10/1999 | Maehara ............ G05D 23/1913 |
| | | | | 219/494 |
| 2003/0067722 | A1 | * | 4/2003 | Vitek .................... H05K 7/207 |
| | | | | 361/24 |
| 2004/0011342 | A1 | | 1/2004 | Fukatsu |
| 2005/0269674 | A1 | | 12/2005 | Kawakita et al. |
| 2006/0071237 | A1 | * | 4/2006 | Deboy .................... H01L 25/16 |
| | | | | 257/133 |
| 2010/0263644 | A1 | * | 10/2010 | Matsuda ................ F02P 9/005 |
| | | | | 123/625 |
| 2015/0243461 | A1 | * | 8/2015 | Werth ................ F02D 41/3005 |
| | | | | 307/116 |

* cited by examiner

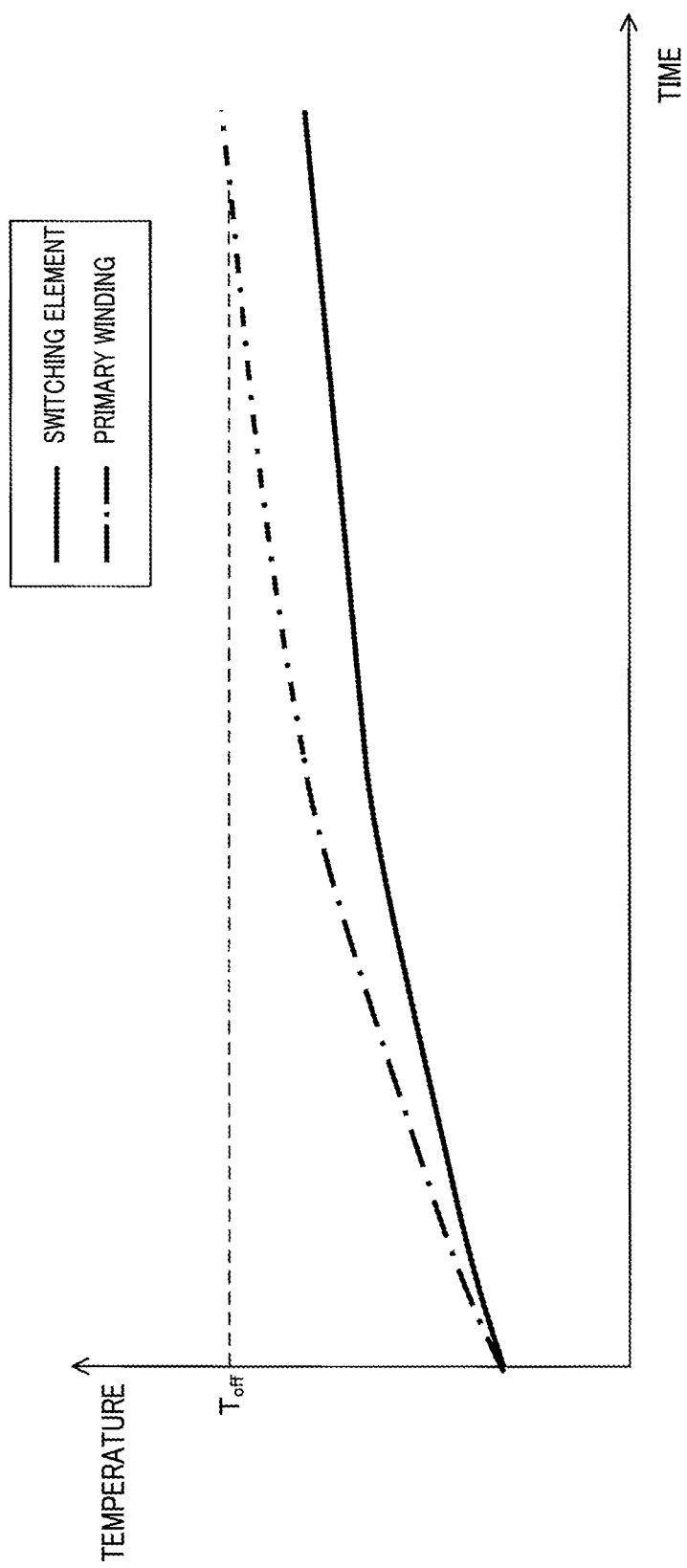

IGNITION DEVICE

CROSS-REFERENCE TO RELATED APPLICATION

This application is based on and claims the benefit of priority from earlier Japanese Patent Application No. 2016-137092 filed Jul. 11, 2016, the description of which is incorporated herein by reference.

BACKGROUND

Technical Field

The present invention relates to an ignition device for igniting a spark plug of an internal combustion engine.

Related Art

An ignition device for igniting a spark plug of an internal combustion engine, comprising an ignition coil having a primary winding and a secondary winding, and a switching element such as an IGBT is known (see Japanese Unexamined Patent Application Publication No. 2006-19700 specified below). One end of the primary winding is connected to a DC power supply. The switching element is connected between the other end of the primary winding and the ground. The secondary winding of the ignition coil is connected with the spark plug.

To ignite the spark plug, first, the switching element is turned on and a primary current is supplied to the primary winding. Then, the switching element is turned off to cut off the primary current. The high secondary voltage generated in the secondary winding at this time is used to ignite the spark plug. The turning on/off of the switching element is controlled by a control device such as an ECU.

In some cases, after a signal for turning the switching element on has been sent from the control device, some kind of abnormality may occur, and the signal for turning it off may not be transmitted for a long time. In such cases, the switching element continues to be on, and as a result the primary current keeps flowing for a long time. The above-mentioned ignition device prevents an especially high primary current from flowing by limiting the primary current to a certain value. However, when the primary current flows for a long time, the temperatures of the switching element and the primary winding rise due to heat generation, which may cause these components to fail. Thus, the ignition device is provided with a temperature sensor for measuring the temperature of the switching element and a thermal cutout circuit. The thermal cutout circuit forcibly turns off the switching element when the measured temperature of the switching element becomes higher than a predetermined temperature (forcible turn-off temperature). Thus, the primary current is forcibly stopped to protect the switching element and the primary winding from high temperature.

However, since the thermal cutout circuit of the ignition device measures the temperature of the switching element, even though it can protect the switching element, the primary winding may not be sufficiently protected from high temperature. That is, as described above, when the switching element is turned on for a long time, both the switching element and the primary winding generate heat due to the primary current. In the above-described ignition device, when the power supply voltage decreases and the balance of heat generation between the switching element and the primary winding is lost, the primary winding may have a higher temperature.

The reason for this will be explained. In the above-described ignition device, energization is continued with a limited primary current at a constant value until the temperature of the switching element reaches the forcible turn-off temperature. When the power supply voltage decreases, the loss in the switching element is reduced, resulting in a reduced amount of heat generated. Accordingly, the temperature of the switching element tends to be lower than when the power supply voltage is high, and it takes a long time to reach the forcible turn-off temperature. On the other hand, since the primary current is controlled to a constant value, the amount of heat generated in the primary winding does not drop greatly even if the power supply voltage decreases.

Thus, the primary winding may have a higher temperature when the power supply voltage decreases and the balance of heat generation between the switching element and the primary winding is lost. The ignition device maintains the forcible turn-off temperature constant regardless of the power supply voltage. Thus, when the power supply voltage decreases, even if the temperature of the primary winding is high, the temperature of the switching element may be relatively low and not reach the forcible turn-off temperature. In such case, since the switching element cannot be turned off, the temperature of the primary winding may further increase.

In consideration of the foregoing, exemplary embodiments of the present invention are directed to providing an ignition device capable of more reliably protecting the primary winding of the ignition coil from high temperature.

SUMMARY

In accordance with an exemplary embodiment of the present invention, there is provided an aspect of the present invention is an ignition device for igniting a spark plug, including: an ignition coil having a primary winding connected to a DC power supply, and a secondary winding connected to the spark plug; a switching element connected to an end of the primary winding that is opposite from an end connected to the DC power supply; a temperature sensor for measuring the temperature of the switching element; and a thermal cutout circuit configured to forcibly turn off the switching element when the temperature of the switching element becomes higher than a predetermined forcible turn-off temperature. In the device, the thermal cutout circuit is further configured to lower the forcible turn-off temperature when a power supply voltage of the DC power supply decreases.

The thermal cutout circuit of the ignition device is further configured to lower the forcible turn-off temperature when the power supply voltage of the DC power supply decreases.

Thus, when the power supply voltage decreases, even if the measured temperature of the switching element becomes lower than when the power supply voltage is high, the temperature can reach the forcible turn-off temperature, and the switching element can be turned off. Accordingly, since the switching element can be turned off at a low temperature, the primary current can be stopped before the temperature of the primary winding becomes too high, and the primary winding can be protected reliably from high temperature.

As described above, according to this aspect, an ignition device capable of more reliably protecting the primary winding of the ignition coil from high temperature can be provided.

It is to be noted that the reference numbers in parentheses in the claims and the Means for Solving the Problem merely indicate the relationships between those elements and the specific means described with respect to the embodiments described below, and they do not limit the technical scope of the present invention.

BRIEF DESCRIPTION OF THE DRAWINGS

In the accompanying drawings:

FIG. 21 is a graph showing changes in the temperatures of the switching element and the primary winding when the power supply voltage is low in a comparative embodiment.

DESCRIPTION OF SPECIFIC EMBODIMENTS

Figure 1:
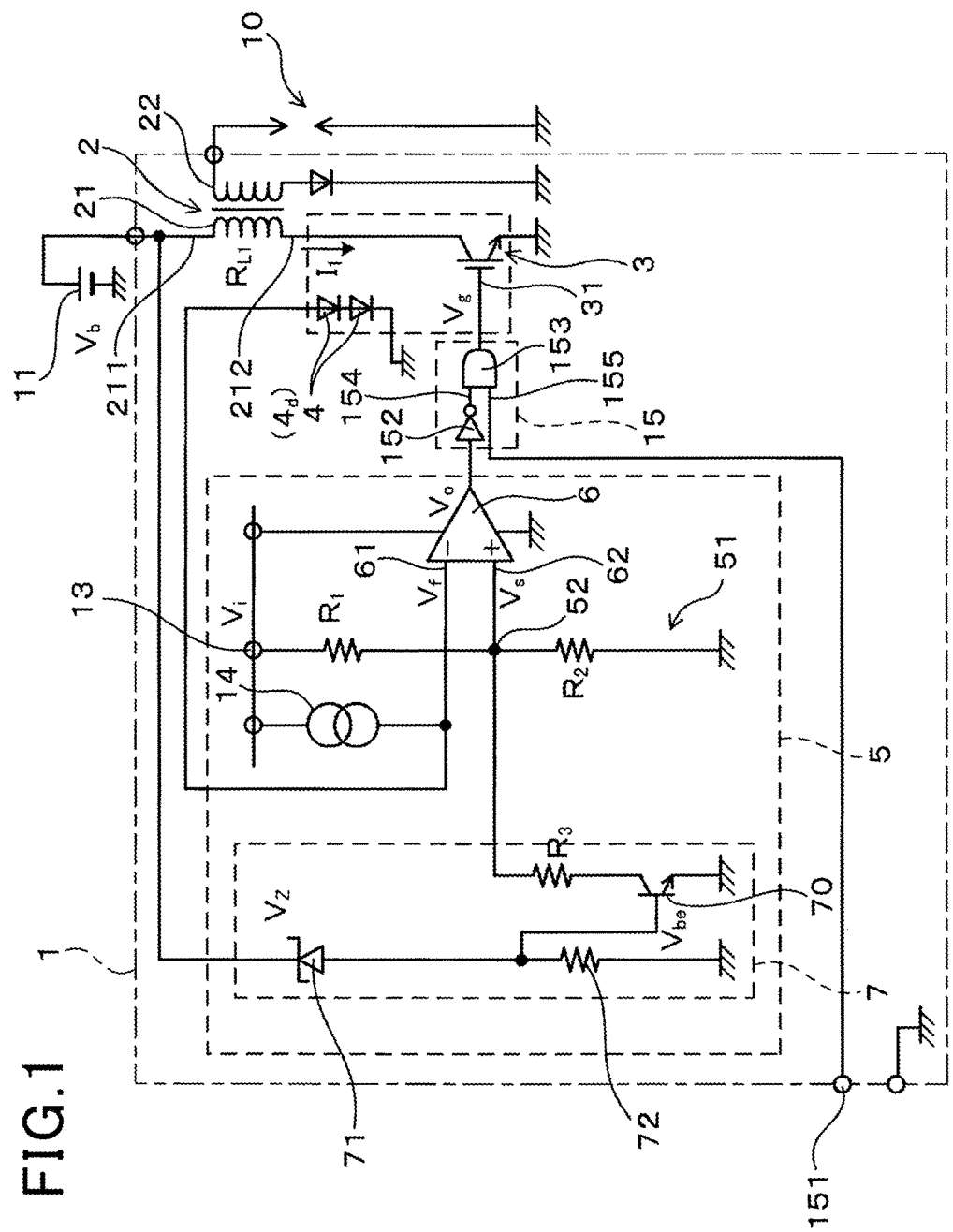
FIG. 1 is a circuit diagram of an ignition device in the first embodiment.

Example embodiments will now be described more fully with reference to the accompanying drawings. Example embodiments are provided so that this disclosure will be thorough, and will fully convey the scope to those who are skilled in the art. Numerous specific details are set forth such as examples of specific components to provide a thorough understanding of embodiments of the present disclosure. It will be apparent to those skilled in the art that example embodiments may be embodied in many different forms and that neither should be construed to limit the scope of the disclosure. Identical or equivalent components or components of equal or equivalent function are thereby identified by the same or similar reference numerals.

First Embodiment

An ignition device in accordance with a first embodiment of the present invention will be described with reference to FIGS. 1-10. The ignition device of the present embodiment may be a vehicle-mounted ignition device, that is, an ignition device mounted in a vehicle. As shown in FIG. 1, an ignition device 1 of this embodiment comprises an ignition coil 2, a switching element 3, a temperature sensor 4, and a thermal cutout circuit 5. The ignition coil 2 includes a primary winding 21 and a secondary winding 22. One end 211 of the primary winding 21 is connected to a DC power supply 11. The DC power supply 11 of this embodiment is a lead storage battery. The switching element 3 is connected between the end 212 of the primary winding 21 that is opposite from the end connected with the DC power supply 11 and the ground. A spark plug 10 is connected to the secondary winding 22.

The temperature sensor 4 is provided to measure the temperature of the switching element 3.

The thermal cutout circuit 5 forcibly turns off the switching element 3 when the temperature of the switching element 3 becomes higher than a predetermined forcible turn-off temperature Toff.

The thermal cutout circuit 5 is configured to lower the forcible turn-off temperature Toff when the power supply voltage Vb of the DC power supply 11 decreases.

As shown in FIG. 1, in this embodiment, an IGBT is used as the switching element 3. The temperature sensor 4 is formed on the surface of this switching element 3 (see FIG. 9). The temperature sensor 4 of this embodiment is a diode 4d. Further, a gate terminal 31 of the switching element 3 is connected to a drive circuit 15. An ignition signal is input from an ECU (not shown) to an input terminal 151 of the drive circuit 15. The switching element 3 is turned on/off in accordance with this ignition signal. In addition, the thermal cutout circuit 5 is connected to the drive circuit 15.

To ignite the spark plug 10, first, the switching device 3 is turned on and a primary current is supplied to the primary winding 21. Then, after the switching element 3 is turned off, a high secondary voltage is generated in the secondary winding 22. This high secondary voltage is used to generate a spark discharge in the spark plug 10.

Figure 5:
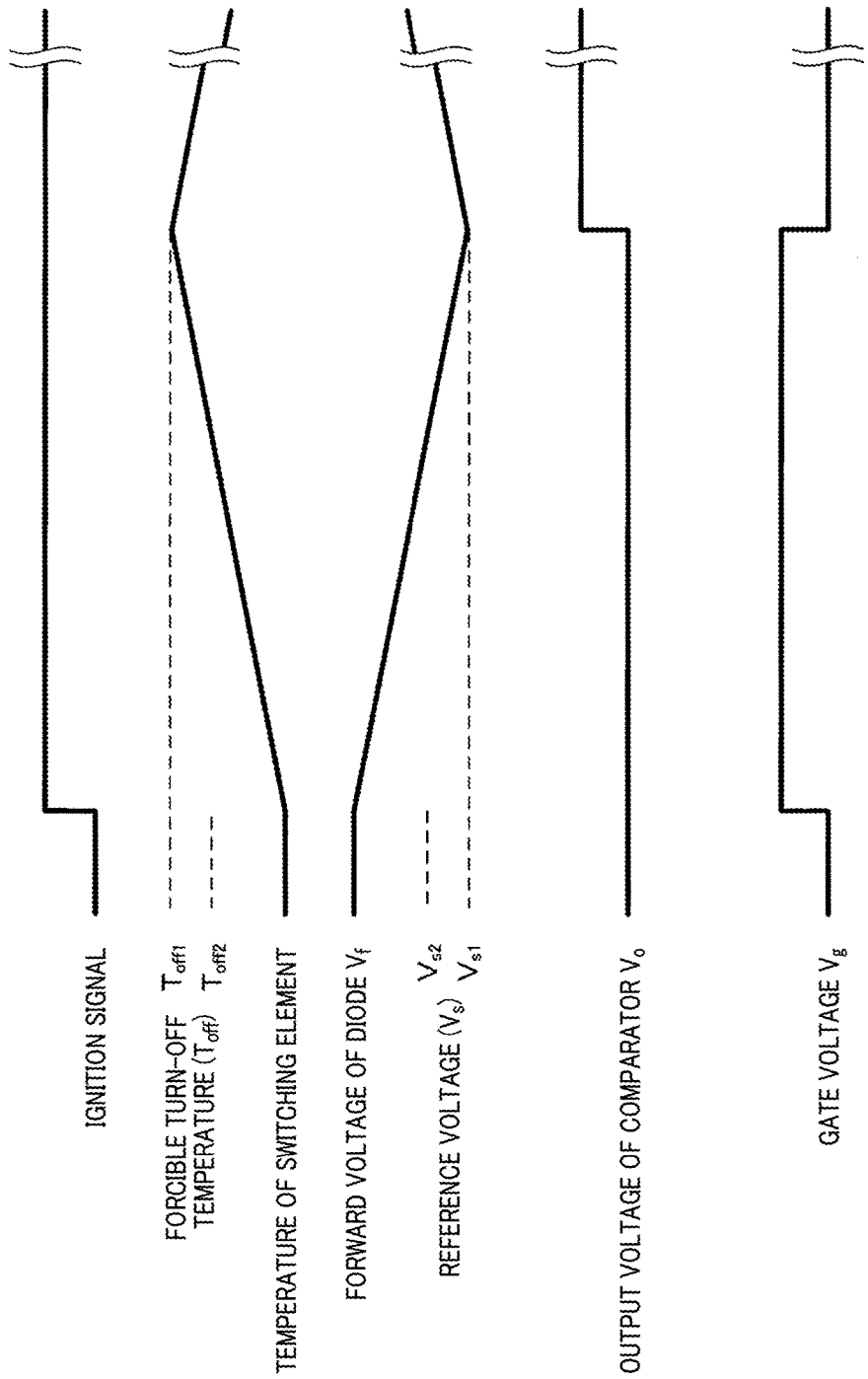
FIG. 5 is a graph showing the waveforms of the ignition signal, the temperature of the switching element, the forward voltage of the diode, the reference voltage, the output voltage of the comparator, and the gate voltage when the power supply voltage is higher than a predetermined value in the first embodiment.

In some cases, after the ignition signal from the ECU 5 becomes H and the switching element 3 is turned on, some kind of abnormality occurs, and the ignition signal will not be switched to L for a long time (see FIG. 5). In such case, since the switching element 3 continues to be on, the primary winding 21 and the switching element 3 generate heat due to the primary current, and their temperatures rise. The thermal cutout circuit 5 prevents these temperatures from rising too high.

Figure 7:
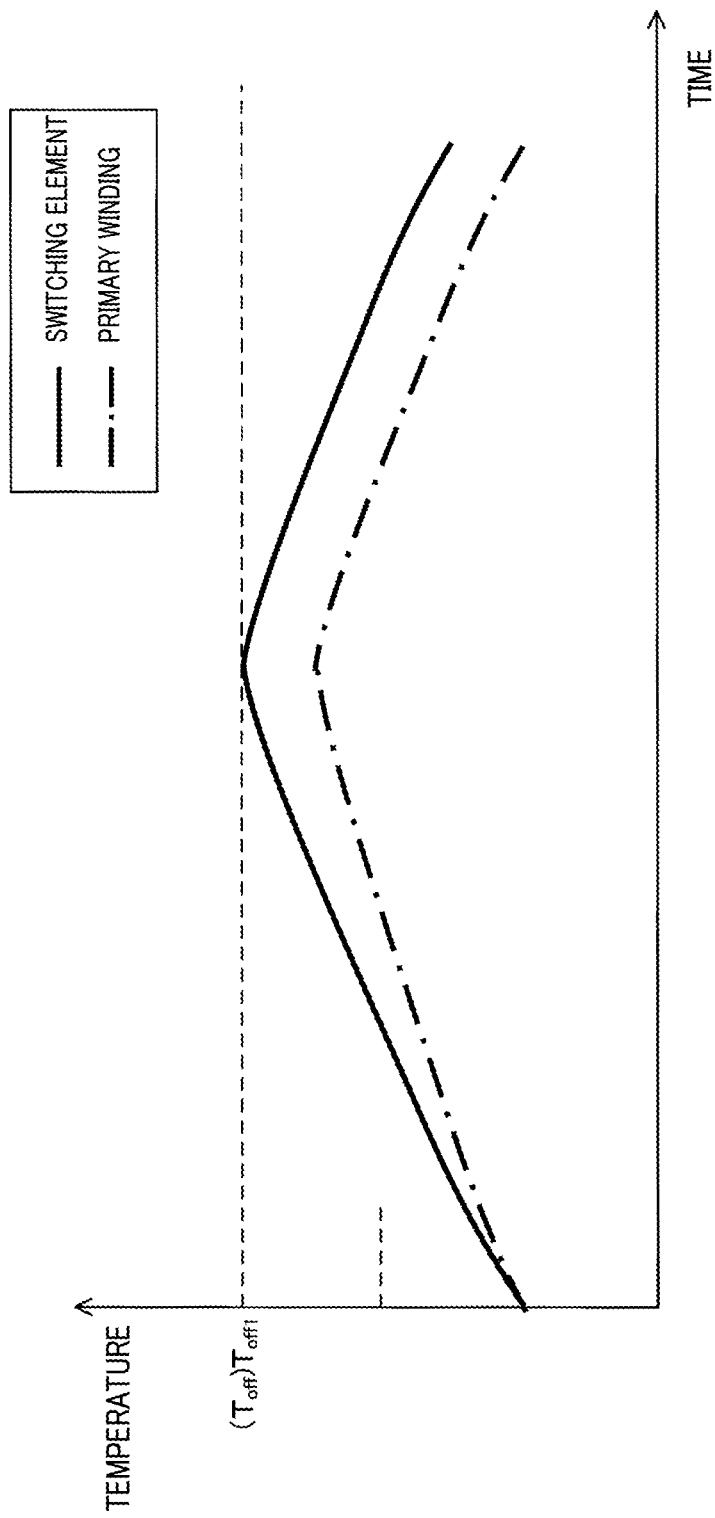
FIG. 7 is a graph showing changes in the temperatures of the switching element and the primary winding when the power supply voltage is higher than a predetermined value in the first embodiment.

That is, when the temperature of the switching element 3 measured by the diode 4*d* becomes higher than the forcible turn-off temperature Toff, the thermal cutout circuit 5 forcibly sets the output voltage (gate voltage Vg) of the drive circuit 15 to L. Thus, the switching element 3 is turned off. As shown in FIG. 7, when the switching element 3 is turned off at the forcible turn-off temperature Toff, heat generation due to the primary current stops, and the temperatures of the switching element 3 and the primary winding 21 gradually decrease. Accordingly, they are protected so that their temperatures stay lower than the forcible turn-off temperature Toff.

Figure 8:
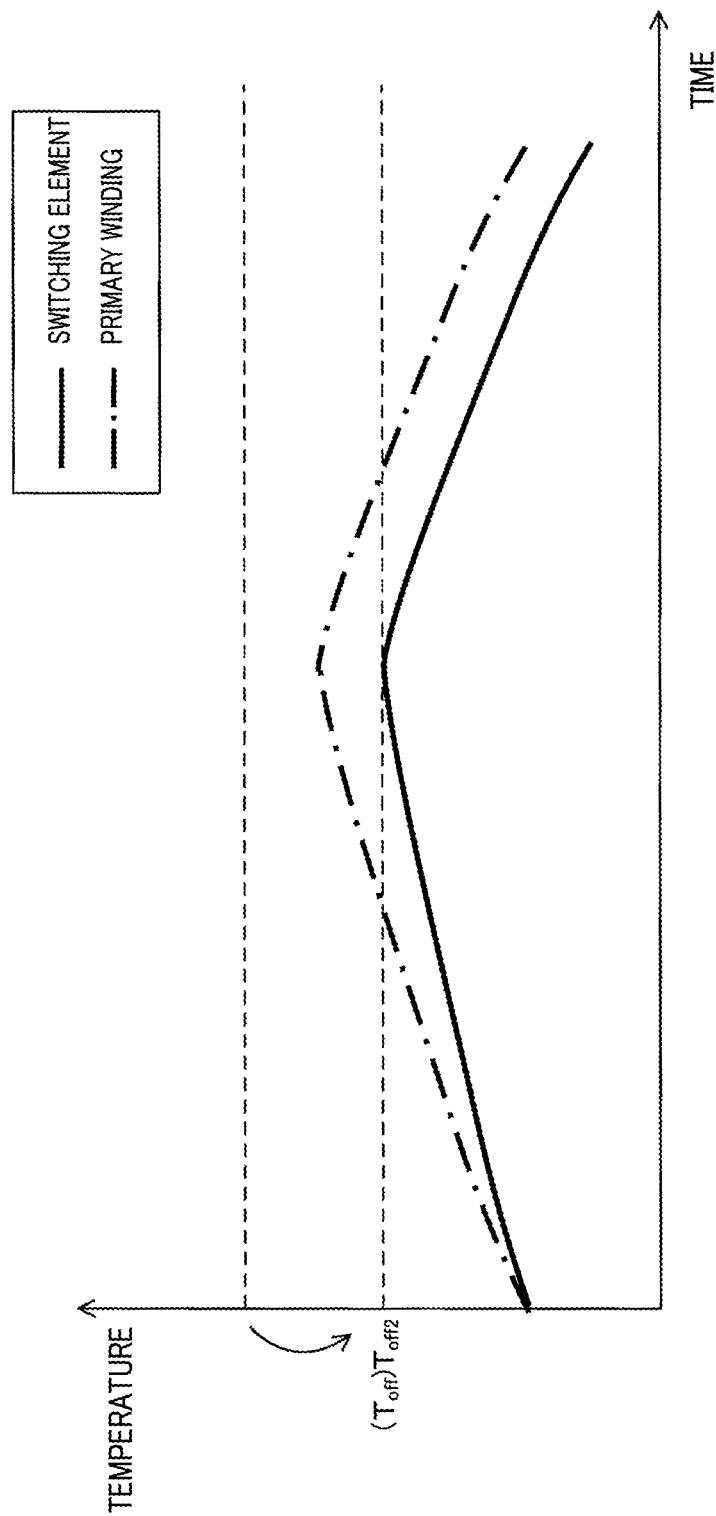
FIG. 8 is a graph showing changes in the temperatures of the switching element and the primary winding when the power supply voltage is lower than a predetermined value in the first embodiment.

As described earlier, the thermal cutout circuit 5 of this embodiment is configured to lower the forcible turn-off temperature Toff when the power supply voltage Vb decreases. That is, when the power supply voltage Vb is higher than a predetermined value, as shown in FIG. 7, the forcible turn-off temperature Toff is set to a relatively high value (first forcible turn-off temperature Toff1), and when the power supply voltage Vb is lower than the predetermined value, as shown in FIG. 8, the forcible turn-off temperature Toff is set to a relatively low value (second forcible turn-off temperature Toff2).

When the power supply voltage Vb is high, as shown in FIG. 7, the temperature of the primary winding 21 is lower than the temperature of the switching element 3. However, when the power supply voltage Vb decreases, as shown in FIG. 8, the heat balance between the primary winding 21 and the switching element 3 changes, and the temperature of the primary winding 21 becomes higher than that of the switching element 3. The reason why such phenomenon occurs will be explained below.

When the primary current is I1 (see FIG. 1) and the resistance value of the primary winding 21 is RL1, the power consumption PL1 of the primary winding 21 can be expressed by the following equation.

$$PL1 = RL1 I1^2$$

In addition, a voltage obtained by subtracting the voltage drop RL1I1 of the primary winding 21 from the power supply voltage V b (Vb−RL1I1) is applied to the switching element 3. Thus, the power consumption PSW of the switching element 3 can be expressed by the following expression.

$$PSW = (Vb - RL1 I1) I1$$

Let RL1=0.5Ω and I1=10 A. When the DC power supply 11 is sufficiently charged and the power supply voltage Vb is high, for example, 14 V, the power consumption PL1 of the primary winding 21 and the power consumption PSW of the switching element 3 respectively have the following values.

$$PL1 = RL1 I1^2 = 0.5 * 10^2 = 50(W)$$

$$PSW = (Vb - RL1 I1) I1 = (14 - 0.5 * 10) * 10 = 90(W)$$

It is also assumed that the DC power supply 11 discharges and the power supply voltage Vb decreases to 7 V. Even then, the ignition device 1 controls the primary current I1 to a constant value (10 A). Thus, PL1 and PSW respectively have the following values.

$$PL1 = RL1 I1^2 = 0.5 * 10^2 = 50(W)$$

$$PSW = (Vb - RL1 I1) I1 = (7 - 0.5 * 10) * 10 = 20(W)$$

As can be seen from the expressions, since the power consumption PSW of the switching element 3 includes the term of the power supply voltage Vb, when the power supply voltage Vb decreases, the power consumption PSW decreases. Thus, the temperature of the switching element 3 does not increase as much as before. On the other hand, since there is no term of the power supply voltage Vb in the power consumption PL1 of the primary winding 21, and the primary current I1 is controlled to a constant value, even when the power supply voltage Vb decreases, the power consumption PL1 hardly changes. Thus, when the power supply voltage Vb decreases, the temperature of the primary winding 21 tends to become higher than that of the switching element 3.

This embodiment is configured such that, even when the power supply voltage Vb decreases and the temperature of the primary winding 21 becomes high, the primary winding 21 can be sufficiently protected. That is, as shown in FIG. 8, when the power supply voltage Vb decreases, the forcible turn-off temperature Toff is set to a relatively low value (second forcible turn-off temperature Toff2). In this way, the switching element 3 can be turned off at a temperature (second forcible turn-off temperature Toff2) that is lower than when the power supply voltage Vb is high (see FIG. 7). Thus, the primary current can be stopped before the temperature of the primary winding 21 becomes too high, and the primary winding 21 can be protected from high temperature.

If the forcible turn-off temperature Toff is constant irrespective of the power supply voltage Vb, the primary winding 21 may not be sufficiently protected from high temperature when the power supply voltage Vb becomes low. That is, as shown in FIG. 21, when the power supply voltage Vb becomes low, the collector loss in the switching element 3 decreases, and thus the amount of heat generated decreases, but the amount of heat generated in the primary winding 21 does not change much since the primary current is controlled to be constant. Thus, the temperature of the primary winding 21 may become too high when the temperature of the switching element 3 reaches the forcible turn-off temperature Toff. Further, the temperature of the switching element 3 may be low and not reach the forcible turn-off temperature Toff. In such case, it is possible that the switching element 3 is not turned off and the primary winding 21 keeps generating heat, resulting in the temperature to rise too high. With regard to this, as shown in FIG. 8, if the forcible turn-off temperature Toff is lowered when the power supply voltage Vb decreases as in this embodiment, the temperature of the switching element 3 can reach the forcible turn-off temperature Toff. Thus, it is possible to turn off the switching element 3 and stop the primary current before the primary winding 21 becomes too hot. Thus, the primary winding 21 can be protected from high temperature.

Figure 9:
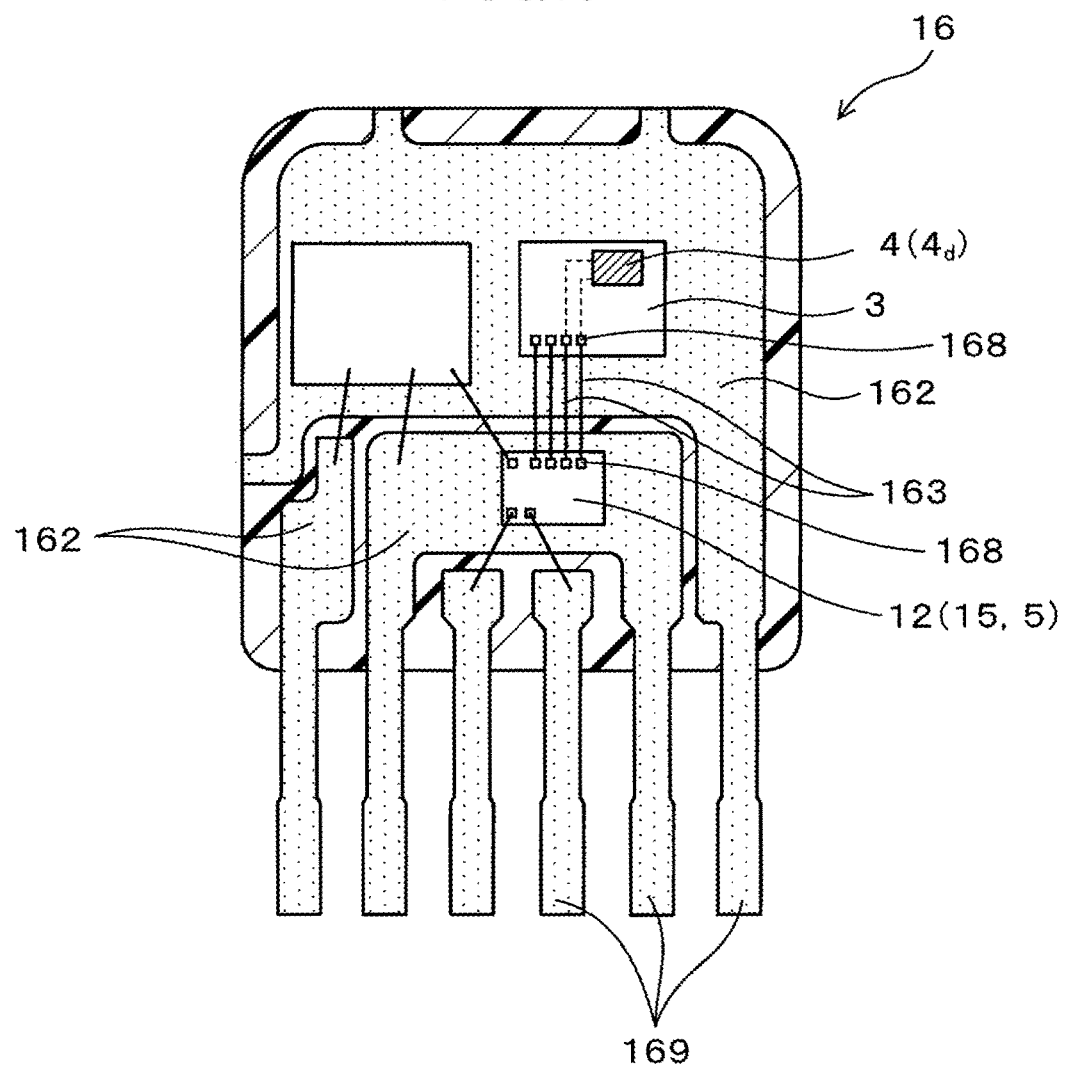
FIG. 9 is a plan view showing the interior of an igniter in the first embodiment.

The first forcible turn-off temperature Toff1 is set to a value lower than the melting temperature of the solder connecting the switching element 3 to a lead frame 162 (see FIG. 9). For example, when the melting temperature of the solder is 220° C., the first forcible turn-off temperature Toff1 can be set to around 200° C. The second forcible turn-off temperature Toff2 can be set to, for example, around 160° C.

Next, the configuration of the thermal cutout circuit 5 will be described. As shown in FIG. 1, the thermal cutout circuit 5 includes a comparator 6, a constant voltage circuit 13, a constant current circuit 14, a first resistor R1, a second resistor R2, and a reference voltage shift circuit 7.

The constant current circuit 14 supplies a constant current to the diode 4*d*. The forward voltage Vf generated in the diode 4*d* is applied to an inverting input terminal 61 of the comparator 6. Further, a reference voltage Vs is applied to a non-inverting input terminal 62 of the comparator 6. The comparator 6 compares the forward voltage Vf with the reference voltage Vs. When the forward voltage Vf becomes lower than the reference voltage Vs, the output voltage Vo becomes H. As a result, the gate voltage Vg of the switching element 3 becomes L, and the switching element 3 turns off.

The operations of the comparator 6 and the drive circuit 15 will be described in more detail. As shown in FIG. 1, the comparator 6 is connected to the constant voltage circuit 13. The comparator 6 outputs a value obtained by multiplying the difference between the reference voltage Vs and the forward voltage Vf of the diode 4 (Vs−Vf) by the voltage gain Av. That is, it outputs the following output voltage VO.

$$VO=Av(Vs-Vf)$$

However, since the voltage gain Av has a very large value and the voltage Vi of the constant voltage circuit 13 is the upper limit value of the output voltage VO, when Vs−Vf>0, the output voltage VO=Vi holds. That is, the output voltage VO becomes H level. Thus, H is input to a NOT gate 152 in the drive circuit 15, and the output of the NOT gate 152 becomes L. Thus, even if one input terminal 154 of the two input terminals 154, 155 of an AND gate 153 is L and the other input terminal 155 receives H from the ECU, the output of the AND gate 153 is always L. Accordingly, no gate voltage is applied to the switching element 3, and the switching element 3 is turned off.

Further, when Vs−Vf<0, the output voltage VO of the comparator 6 becomes 0 (V). That is, the output voltage VO becomes L level. Thus, L is input to the NOT gate 152, and the output of the NOT gate 152 becomes H. Thus, when one input terminal 154 of the AND gate 153 is H and the other input terminal 155 receives H from the ECU, the output of the AND gate 153 becomes H. Thus, the switching element 3 turns on.

Figure 3:
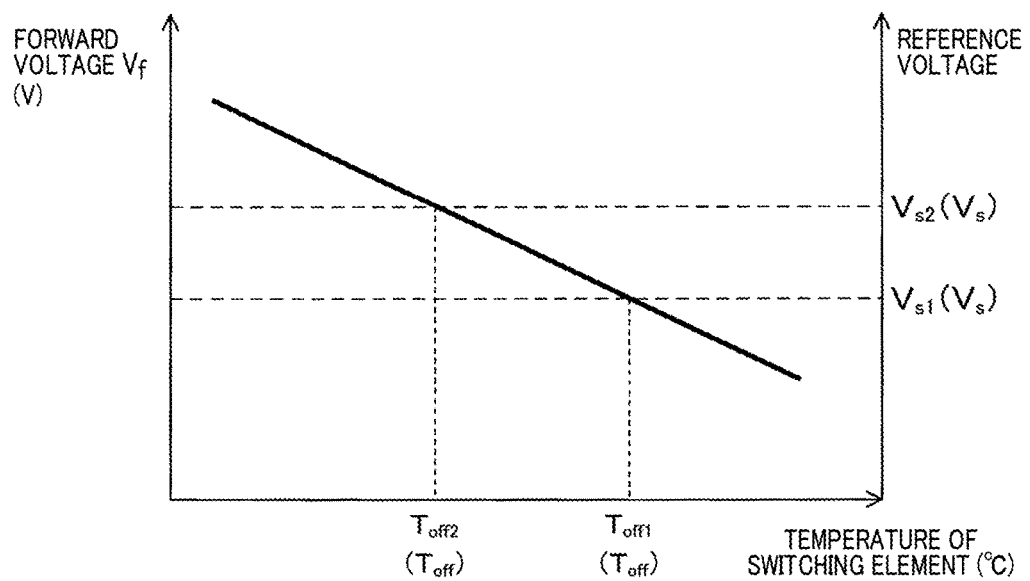
FIG. 3 is a graph showing the relationships of the forward voltage of the diode and the reference voltage with the temperature of the switching element in the first embodiment.

As shown in FIG. 3, the forward voltage Vf of the diode 4*d* decreases when the temperature rises. Thus, when the switching element 3 generates heat and the temperature exceeds the forcible turn-off temperature Toff, the forward voltage Vf becomes equal to or lower than the reference voltage Vs (Vf<Vs). That is, Vs−Vf>0. Accordingly, the output voltage VO of the comparator 6 becomes H. Thus, even when one input terminal 154 of the AND gate 153 in the drive circuit 15 (see FIG. 1) becomes L and the other input terminal 155 receives H from the ECU, the output of the AND gate 153 is L. Thus, the switching element 3 turns off. That is, irrespective of the command from the ECU, the switching element 3 is forcibly turned off.

In addition, as shown in FIG. 1, the thermal cutout circuit 5 of this embodiment includes the reference voltage shift circuit 7. When the power supply voltage Vb decreases, the reference voltage shift circuit 7 shifts the reference voltage Vs from a relatively low value (the first reference voltage Vs1, see FIG. 3) to a relatively high value (the second reference voltage Vs2). In other words, when the power supply voltage Vb decreases, the reference voltage shift circuit 7 shifts the temperature at which the switching element 3 is turned off from a relatively high first forcible turn-off temperature Toff1 to a relatively low second forcible turn-off temperature Toff2.

As shown in FIG. 1, the reference voltage shift circuit 7 includes a zener diode 71, a resistor 72, a transistor 70, and a third resistor R3. The breakdown voltage Vz of the zener diode 71 is set lower than the maximum value of the power supply voltage Vb. For example, when the maximum value of the power supply voltage Vb is 14 V, the breakdown voltage Vz of the zener diode 71 can be set to around 8 V. The third resistor R3 is connected in parallel to the second resistor R2. The transistor 70 is connected in series to the third resistor R3. The three resistors R1, R2, and R3 forms the voltage dividing circuit 51.

The reference voltage Vs has a value obtained by dividing the voltage Vi of the constant voltage circuit 13 by the voltage dividing circuit 51. That is, assuming that the resistance from the connection point 52 of the two resistors R2 and R3 to the ground is Rp, the reference voltage Vs can be expressed by the following expression.

$$Vs=ViRp/(R1+Rp) \quad (1)$$

Further, when the power supply voltage Vb is higher than the sum of the base-emitter voltage Vbe of the transistor 70 and the breakdown voltage Vz (Vz+Vbe), the Zener diode 71 breaks down and the transistor 70 turns on. Thus, the resistance Rp from the connection point 52 to the ground has the following value.

$$Rp=R2R3/(R2+R3) \quad (2)$$

When the power supply voltage Vb becomes lower than Vz+Vbe, the zener diode 71 does not break down and the transistor 70 turns off. Thus, the resistance Rp from the connection point 52 to the ground will be equal to the second resistance R2.

$$Rp=R2 \quad (3)$$

As described above, when the power supply voltage Vb is higher than Vz+Vbe, the resistance value Rp becomes relatively low, and the reference voltage Vs represented by Expression (1) becomes relatively low. On the other hand, when the power supply voltage Vb is lower than Vz+Vbe, the resistance value Rp becomes relatively high and the reference voltage Vs becomes relatively high. Therefore, the relationship between the power supply voltage Vb and the reference voltage Vs is as shown in the graph of FIG. 2.

Figure 2:
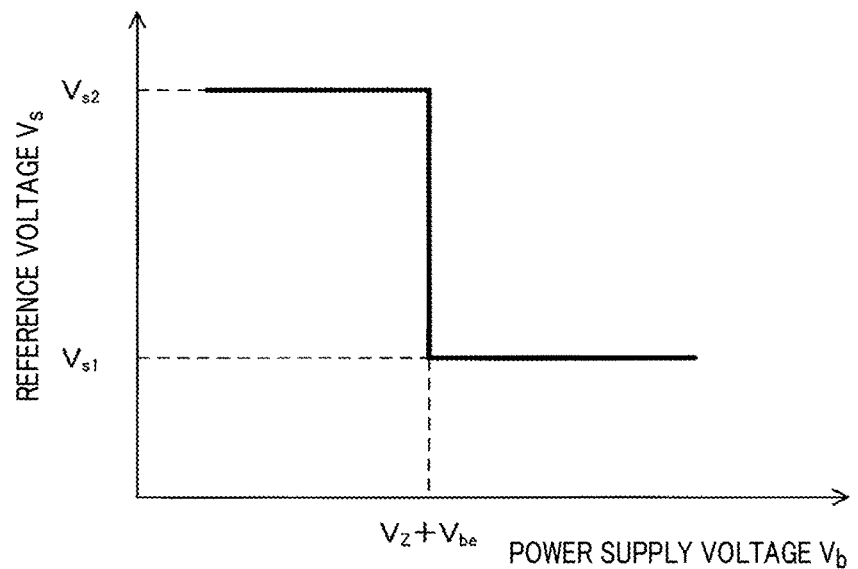
FIG. 2 is a graph showing the relationship between the power supply voltage and the reference voltage in the first embodiment.

In FIG. 2, the first reference voltage Vs1 is a value obtained by substituting Equation (2) into Equation (1), and is expressed by the following equation.

$$Vs1=ViR2R3/(R1R2+R1R3+R2R3)$$

In addition, the second reference voltage Vs2 is a value obtained by substituting Equation (3) into Equation (1), and is expressed by the following equation.

$$Vs2=ViR2/(R1+R2)$$

As shown in FIG. 5, for example, when an abnormality occurs and the above ignition signal remains H for a long time, the temperature of the switching element 3 rises. Accordingly, the forward voltage Vf of the diode 4*d* decreases due to the temperature characteristic. As described above, in this embodiment, when the power supply voltage Vb is higher than Vz+Vbe, the reference voltage Vs is set to a relatively low first reference voltage Vs1. Thus, after the forward voltage Vf has become lower, that is, the switching element 3 has reached a relatively high temperature (first forcible turn-off temperature Toff1), the output voltage Vo of the comparator 6 switches to H, and the gate voltage Vg of the switching element 3 becomes L. Then, the switching element 3 turns off and the temperature gradually decreases.

When the switching element 3 turns off and the temperature decreases, the forward voltage Vf gradually increases. Thus, the forward voltage Vf becomes higher than the reference voltage Vs. However, in this embodiment, since the comparator 6 is provided with a hysteresis circuit (not shown), after the output voltage Vo becomes H, the output remains H for a while even after the forward voltage Vf has become higher than the reference voltage Vs.

Figure 6:
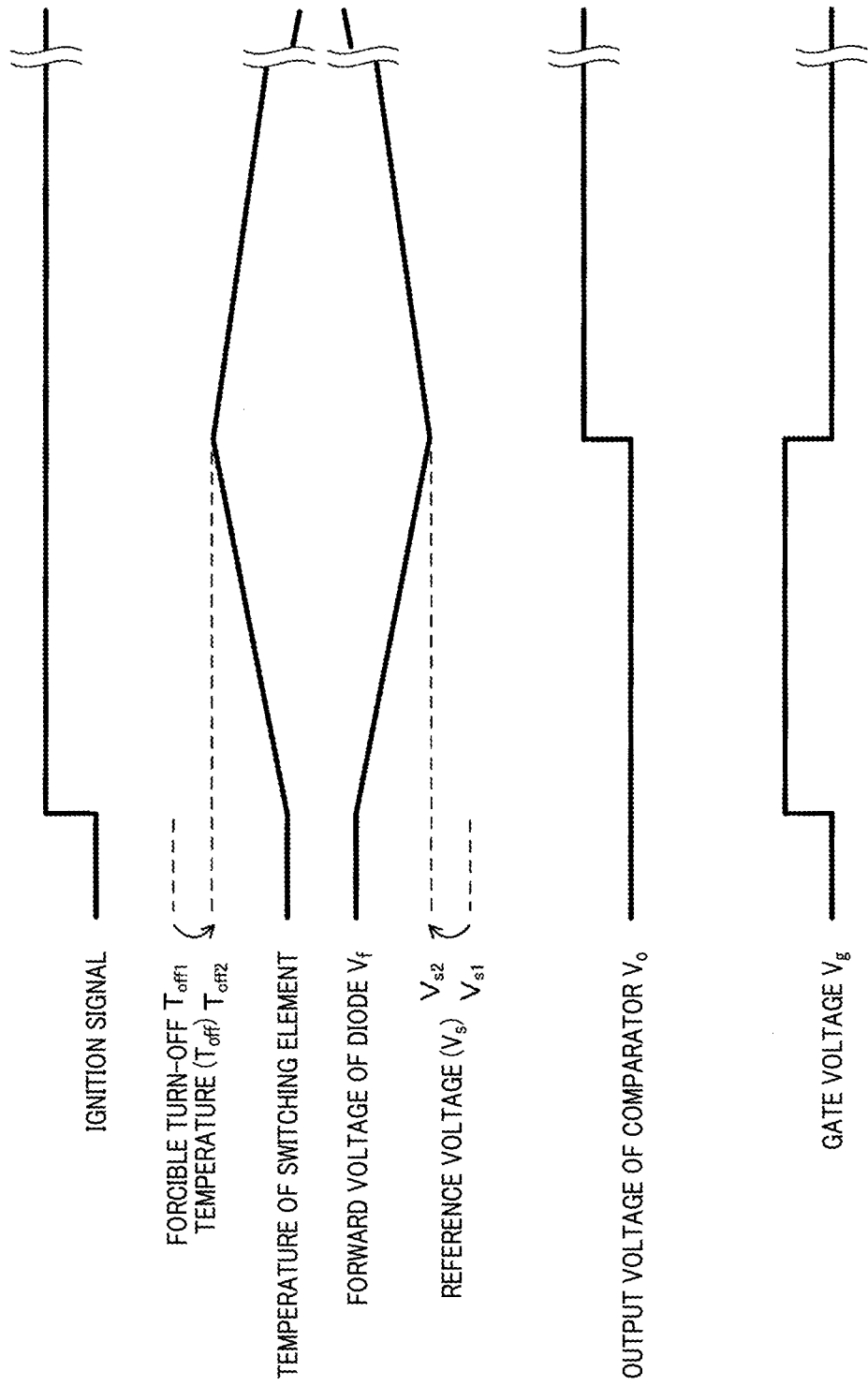
FIG. 6 is a graph showing the waveforms of the ignition signal, the temperature of the switching element, the forward voltage of the diode, the reference voltage, the output voltage of the comparator, and the gate voltage when the power supply voltage is lower than a predetermined value in the first embodiment.

In addition, as shown in FIG. 6, when the power supply voltage Vb is lower than Vz+Vbe, as described earlier, the reference voltage Vs is switched to a relatively high value (second reference voltage Vs2). Thus, as compared to the case shown in FIG. 5, when the forward voltage Vf is high, that is, the temperature of the switching element 3 is low (second forcible turn-off temperature Toff2), the output voltage Vo of the comparator 6 becomes H, and the switching element 3 turns off.

Next, the three-dimensional structure of the ignition device 1 will be described. As shown in FIG. 9, in this embodiment, the switching element 3 and a control IC 12 are integrated into a single component (igniter 16). In the control IC 12, components such as the drive circuit 15 and the thermal cutout circuit 5 are formed. The control IC 12 is operated by the electric power supplied from the DC power supply 11 (see FIG. 1). As described above, the diode 4d is formed on the surface of the switching element 3. The switching element 3 and the control IC 12 are mounted on a lead frame 162 also serving as a heat sink.

Figure 10:
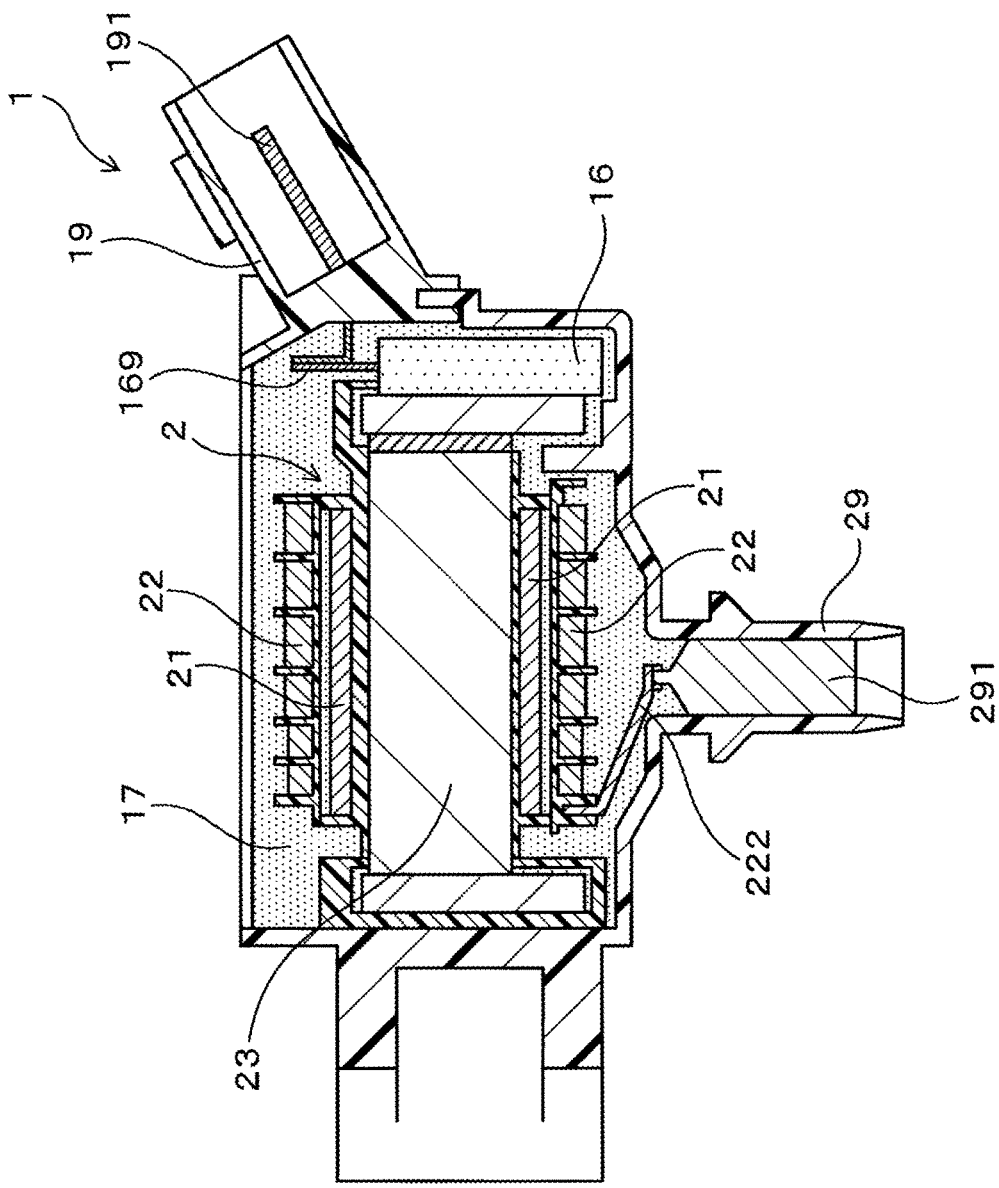
FIG. 10 is a cross section of the ignition device in the first embodiment.

As shown in FIG. 10, in this embodiment, the ignition coil 2 and the igniter 16 are integrated into a single component. The ignition coil 2 includes a core 23, the primary winding 21, and the secondary winding 22. The ignition coil 2 and the igniter 16 are sealed with a sealing member 17 made of insulating resin. A terminal 169 of the igniter 16 is connected to a connector terminal 191 of an input connector 19. Further, a terminal 222 of the second winding 22 is connected to a connector terminal 291 of an output connector 29.

Next, the function and effect of this embodiment will be described. The thermal cutout circuit 5 of this embodiment is configured to lower the forcible turn-off temperature Toff when the power supply voltage Vb of the DC power supply 11 decreases, as shown in FIG. 8.

Thus, when the power supply voltage Vb decreases, even if the measured temperature of the switching element 3 is low, the forcible turn-off temperature Toff can be reached, and the switching element 3 can be turned off. Accordingly, when the power supply voltage Vb decreases, even if the temperature of the primary winding 21 becomes higher than that of the switching element 3, the switching element 3 can be turned off at a low temperature, and therefore the primary current can be stopped before the temperature of the primary winding 21 becomes too high. Thus, the primary winding 21 can be reliably protected from high temperature.

Further, in this embodiment, the diode 4d is used as the temperature sensor 4. As shown in FIG. 1, the thermal cutout circuit 5 includes the comparator 6 and the reference voltage shift circuit 7. The comparator 6 compares the forward voltage Vf of the diode 4d with the reference voltage Vs, and when the forward voltage Vf is lower than the reference voltage Vs, sets the output voltage Vo to H. As a result, the switching element 3 is forcibly turned off. The reference voltage shift circuit 7 is configured to increase the reference voltage Vs when the power supply voltage Vb decreases. As a result, the forcible turn-off temperature Toff is lowered (see FIGS. 5 and 6).

Therefore, the forcible turn-off temperature Toff can be reliably lowered when the power supply voltage Vb decreases.

Figure 4:
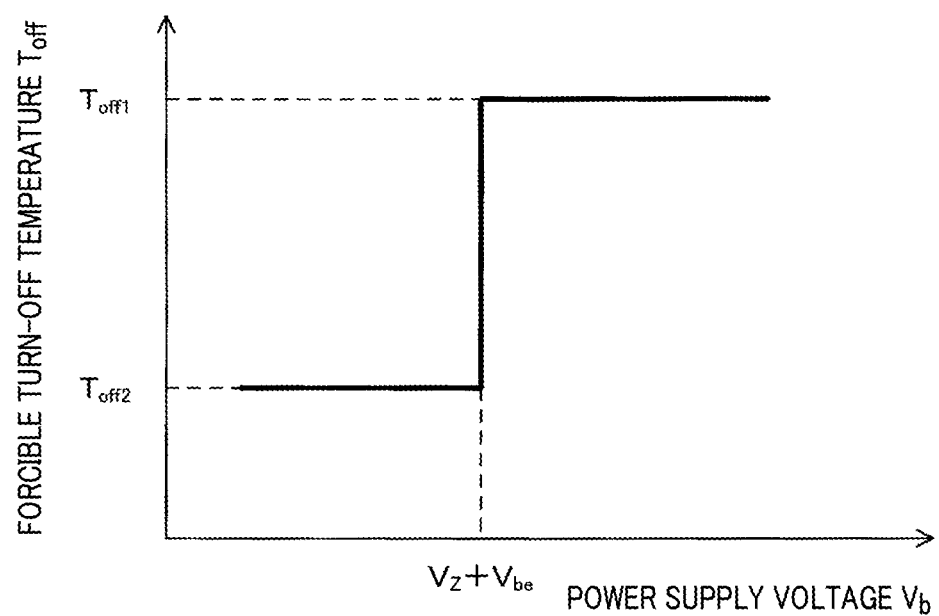
FIG. 4 is a graph showing the relationship between the power supply voltage and the forcible turn-off temperature in the first embodiment.

In addition, as shown in FIG. 4, in this embodiment, the forcible turn-off temperature Toff is lowered stepwise as the power supply voltage Vb decreases.

As will be described later, it is also possible to continuously lower the forcible turn-off temperature Toff as the power supply voltage Vb decreases, but the circuit configuration tends to become complicated. Thus, the manufacturing cost of the ignition device 1 tends to increase. On the other hand, if the forcible turn-off temperature Toff is decreased stepwise as in this embodiment, the circuit configuration of the thermal cutout circuit 5 can be simplified. This allows the manufacturing cost of the ignition device 1 to be reduced.

As shown in FIG. 9, the temperature sensor 4 is provided on the switching element 3.

Thus, it is possible to accurately measure the temperature of the switching element 3 by the temperature sensor 4.

As described above, according to this embodiment, an ignition device capable of more reliably protecting the primary winding of the ignition coil from high temperature can be provided.

In the embodiments described below, among the reference numbers used in their drawings, the same reference numbers as those used in the first embodiment denote components or the like that are similar to those of the first embodiment unless otherwise noted.

Second Embodiment

Figure 11:
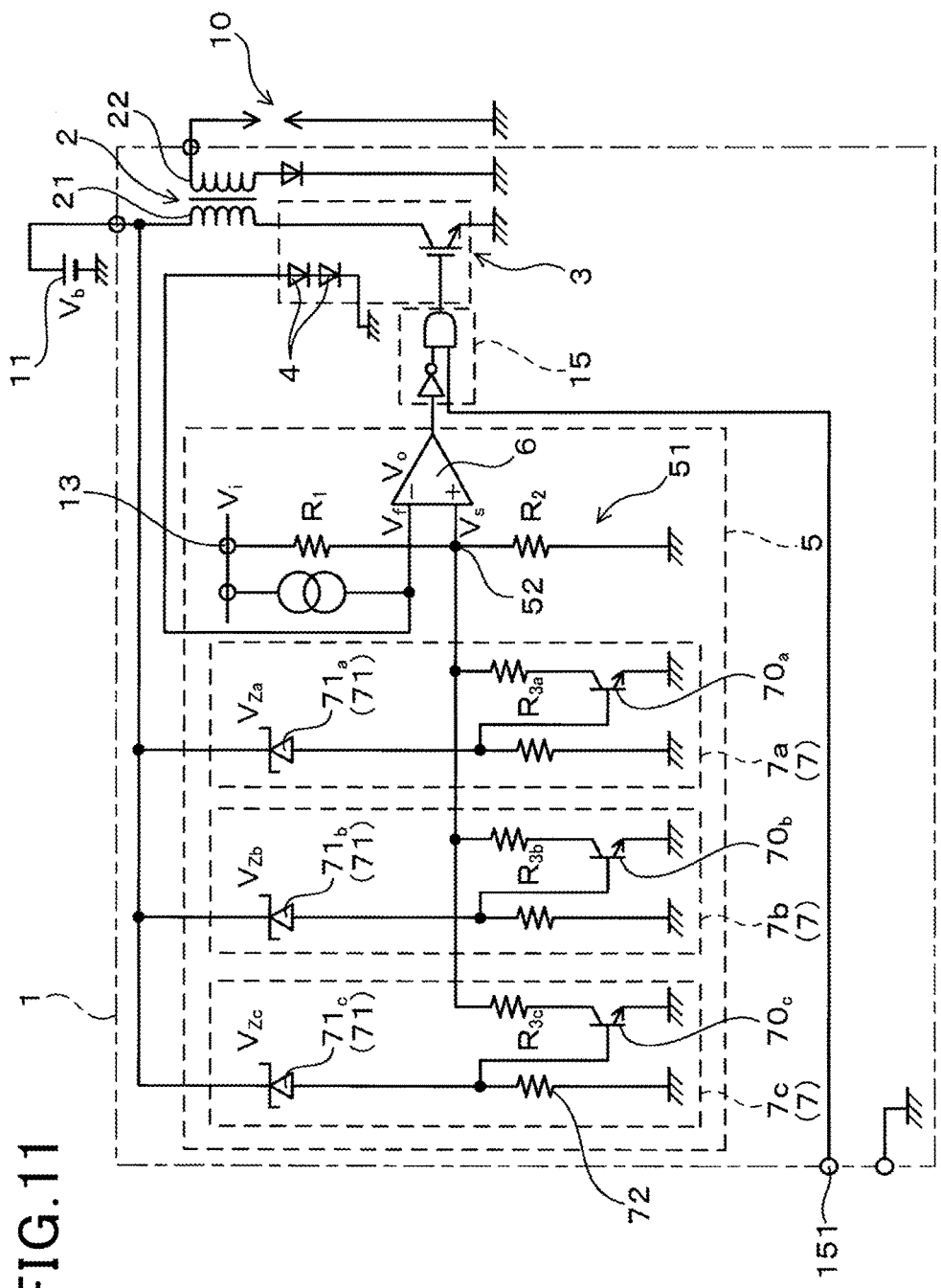
FIG. 11 is a circuit diagram of the ignition device in the second embodiment.

This embodiment is an example in which the number of reference voltage shift circuits 7 is changed. As shown in FIG. 11, the ignition device 1 of this embodiment includes a plurality of reference voltage shift circuits 7 (7a-7c). Similarly to the first embodiment, each of the reference voltage shift circuits 7 includes a Zener diode 71, a resistor 72, a third resistor R3 (R3a-R3c), and a transistor 70.

The breakdown voltage Vz of each Zener diode 71 is different from one another. The breakdown voltage Vza of the first zener diode 71a is the highest and the breakdown voltage Vzc of the third zener diode 71c is the lowest. The breakdown voltage Vzb of the second Zener diode has a value between Vza and Vzc. As with the first embodiment, these breakdown voltages Vz are set to values lower than the power supply voltage Vb.

When the power supply voltage Vb decreases, first, the first Zener diode 71a stops to break down. Thus, the transistor 70a of the first reference voltage shift circuit 7a turns off, and current does not flow to the third resistor R3a of the first reference voltage shift circuit 7a. Thus, the resistance Rp from the connection point 52 to the ground increases, and the reference voltage Vs increases. When the power supply voltage Vb further decreases, then, the second Zener diode 71b and the third Zener diode 71c stop to break down in turn, and the reference voltage Vs increases stepwise.

Figure 12:
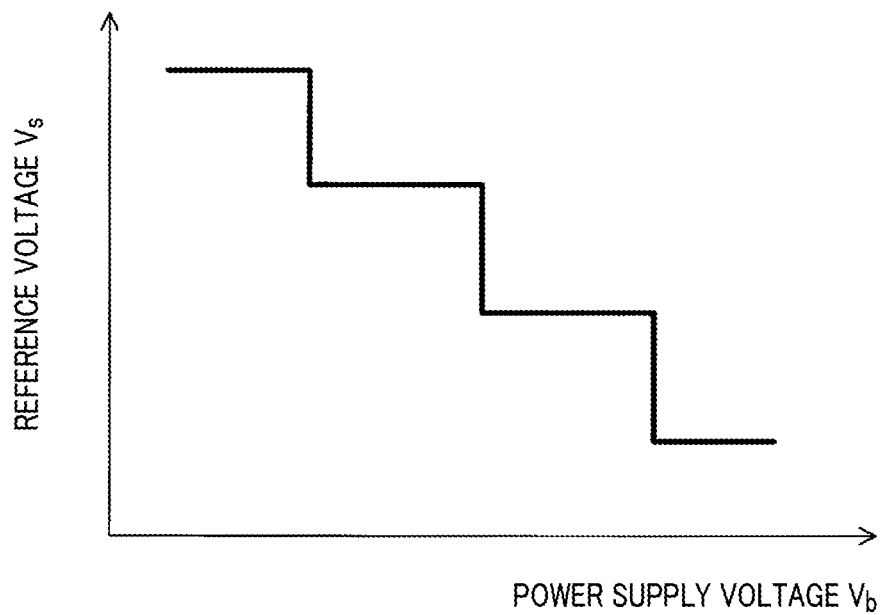
FIG. 12 is a graph showing the relationship between the power supply voltage and the reference voltage in the second embodiment.
Figure 13:
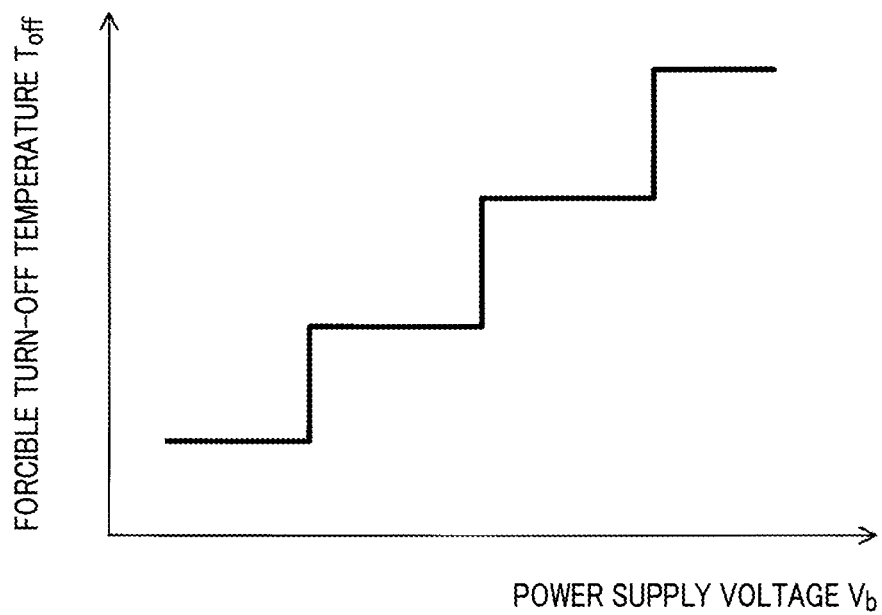
FIG. 13 is a graph showing the relationship between the power supply voltage and the forcible turn-off temperature in the second embodiment.

As shown in FIG. 12, the reference voltage Vs increases intermittently each time the number of zener diodes 71 that stopped to break down increases along with the decrease in the power supply voltage Vb. In addition, when the reference voltage Vs increases, the forcible turn-off temperature Toff decreases. Thus, as shown in FIG. 13, in this embodiment, the forcible turn-off temperature Toff decreases stepwise a plurality of times as the power supply voltage Vb decreases.

The function and effect of this embodiment will be described. As shown in FIG. 13, in this embodiment, the forcible turn-off temperature Toff decreases a plurality of times as the power supply voltage Vb decreases. Thus, when the power supply voltage Vb decreases slightly and the temperature of the primary winding 21 becomes slightly higher than that of the switching element 3, the forcible turn-off temperature Toff can be slightly lowered. When the power supply voltage Vb decreases greatly and the temperature difference between the switching element 3 and the primary winding 21 becomes large, the forcible turn-off temperature Toff can be greatly lowered. Thus, the forcible turn-off temperature Toff can be set to an appropriate value depending on the temperature difference between the switching element 3 and the primary winding 21.

In addition, this embodiment has a similar configuration, and similar functions and effects as those of the first embodiment.

Third Embodiment

Figure 14:
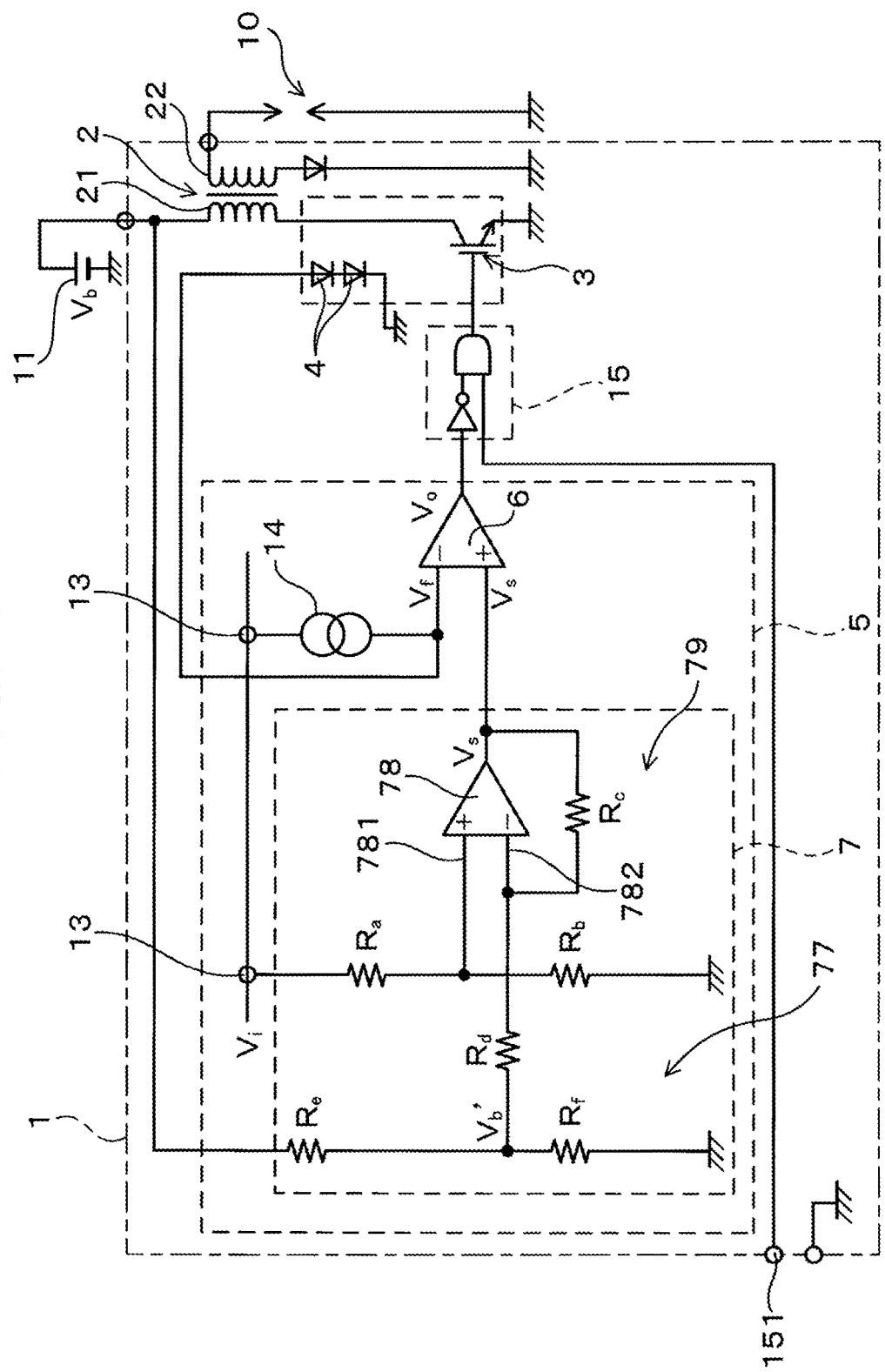
FIG. 14 is a circuit diagram of the ignition device in the third embodiment.

This embodiment is an example in which the configuration of the reference voltage shift circuit 7 is changed. As shown in FIG. 14, the reference voltage shift circuit 7 of this embodiment includes a subtraction circuit 79 and the voltage dividing circuit 77. The voltage dividing circuit 77 includes two resistors Re and Rf connected in series with each other. The power supply voltage V b is applied to the voltage dividing circuit 77. The voltage dividing circuit 77 provides a divided voltage value Vb' of the power supply voltage Vb. The divided voltage value Vb' can be expressed by the following expression.

$$Vb'=VbRf/(Re+Rf)$$

Further, the subtraction circuit 79 includes an operational amplifier 78 and a plurality of resistors Ra-Rd. A non-inverting input terminal 781 of the operational amplifier 78 is connected to the constant voltage circuit 13. An inverting input terminal 782 of the operational amplifier 78 is connected to the voltage dividing circuit 77. The output of the subtraction circuit 79 is input to the comparator 6 as the reference voltage Vs. Adjusting the values of the resistors Ra to Rd, the output of the subtracting circuit 79, i.e., the reference voltage Vs can be set to, for example, a value obtained by subtracting the divided voltage Vb' from the voltage Vi of the constant voltage circuit 13. That is, $$Vs=Vi-Vb'=Vi-VbRf/(Re+Rf).$$

Figure 15:
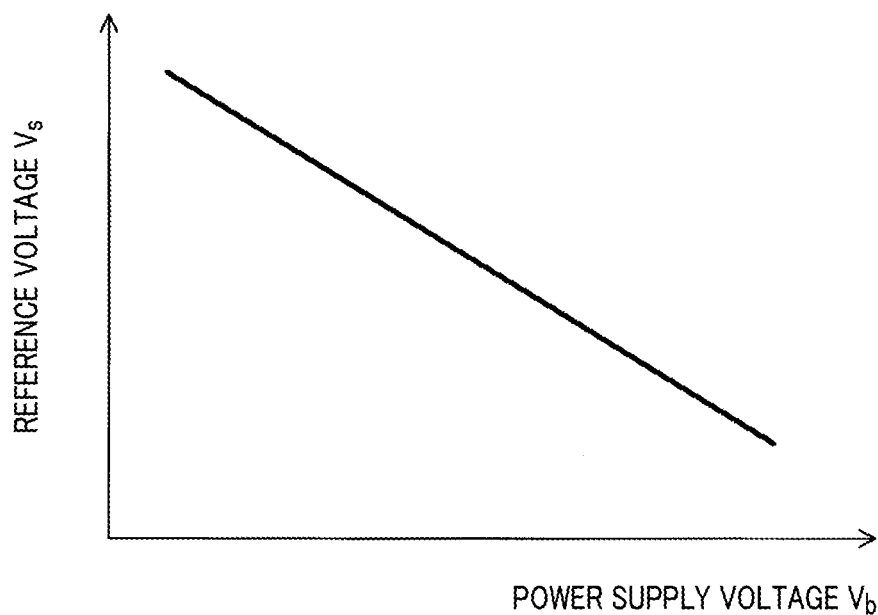
FIG. 15 is a graph showing the relationship between the power supply voltage and the reference voltage in the third embodiment.
Figure 16:
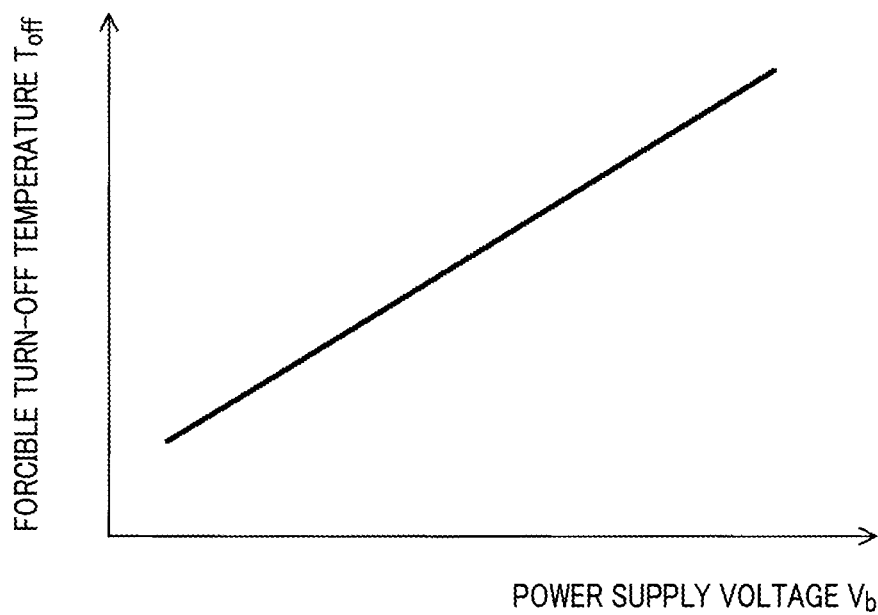
FIG. 16 is a graph showing the relationship between the power supply voltage and the forcible turn-off temperature in the third embodiment.

In this way, as shown in FIG. 15, the reference voltage Vs can be continuously increased as the power supply voltage Vb decreases. Thus, as shown in FIG. 16, the forcible turn-off temperature Toff can be continuously decreased as the power supply voltage Vb decreases.

The functions and effects of this embodiment will be described. As shown in FIG. 16, in this embodiment, the forcible turn-off temperature Toff decreases continuously as the power supply voltage Vb decreases. Thus, the forcible turn-off temperature Toff can be continuously changed depending on the amount of decrease of the power supply voltage Vb, and the forcible turn-off temperature Toff can be set to an optimum value.

In addition, this embodiment has a similar configuration, and similar functions and effects as those of the first embodiment.

Fourth Embodiment

Figure 17:
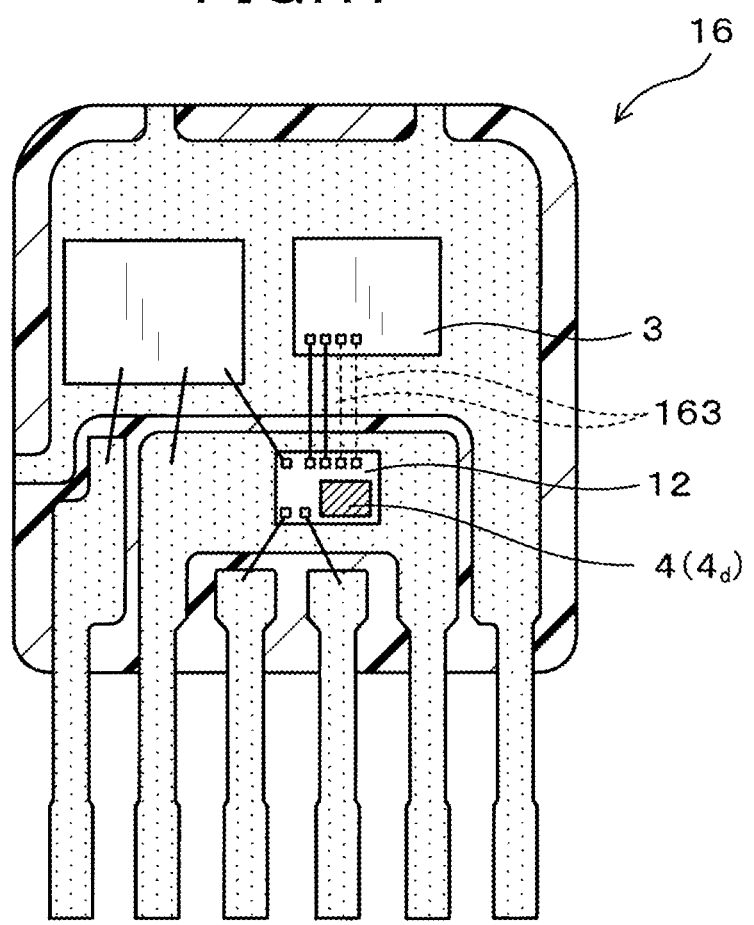
FIG. 17 is a plan view showing the interior of an igniter in the fourth embodiment.

This embodiment is an example in which the position at which the temperature sensor 4 is provided is changed. As shown in FIG. 17, in this embodiment, the temperature sensor 4 is formed at the control IC 12. The control IC 12 is placed adjacent to the switching element 3. Although the temperature sensor 4 cannot directly detect the temperature of the switching element 3, since it is placed at a position adjacent to the switching element 3, it is possible to detect the temperature of the switching element 3 with correlation. Thus, the temperature of the switching element 3 can be measured even if the temperature sensor 4 is provided at the control IC 12. Further, as with the first embodiment, the diode 4d is used as the temperature sensor 4 in this embodiment.

The functions and effects of this embodiment will be described. When the temperature sensor 4 is formed at the switching element 3 as in the first embodiment (see FIG. 9), the temperature sensor 4 needs to be electrically connect to the control IC 12 via a wire 163. On the other hand, as shown in FIG. 17, when the temperature sensor 4 is formed at the control IC 12 as in this embodiment, the wire 163 for connecting them is not required. Thus, the number of wires 163 can be reduced. Since the wires 163 are formed of Au or the like, the manufacturing cost of the ignition device 1 can be reduced greatly by reducing the number of wires 163.

In addition, this embodiment has a similar configuration, and similar functions and effects as those of the first embodiment.

Fifth Embodiment

Figure 18:
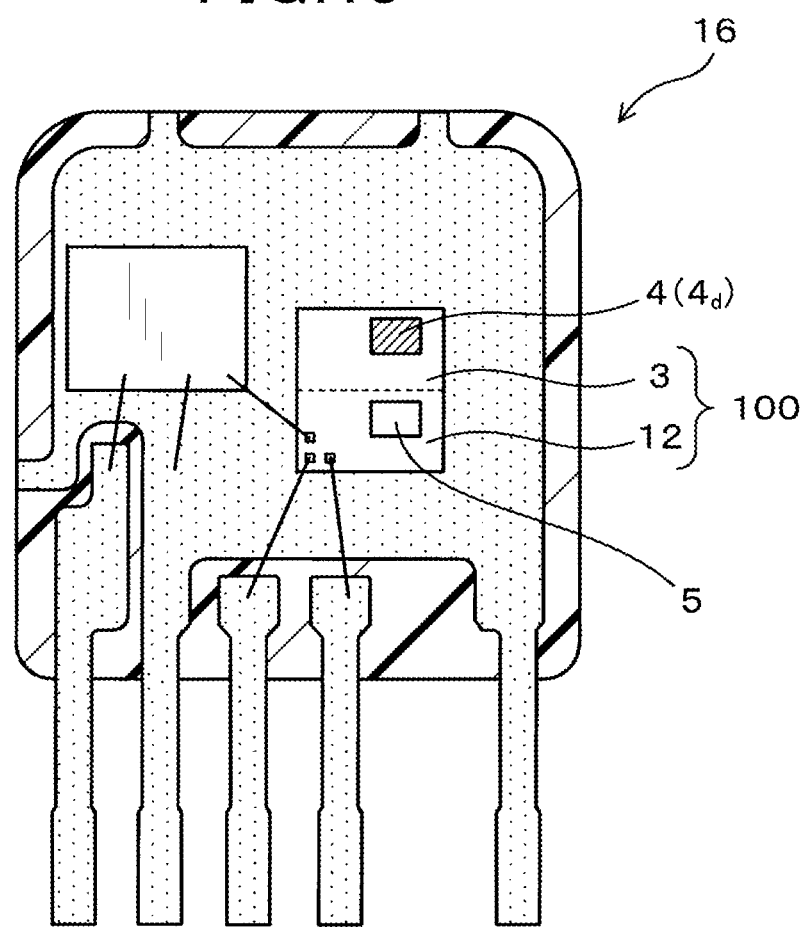
FIG. 18 is a plan view showing the interior of an igniter in the fifth embodiment.

This embodiment is an example in which the configurations of the switching element and the control IC 12 are changed. As shown in FIG. 18, in this embodiment, the control IC 12 and the switching element 3 are integrated into a single component, a semiconductor chip 100. The temperature sensor 4 is provided at the switching element 3. The thermal cutout circuit 5 is formed in the control IC 12.

In the above-described configuration, since the control IC 12 is formed in the same semiconductor chip 100 as the switching element 3, the temperature of the switching element 3 can be detected regardless of whether the temperature sensor 4 is provided in the switching element 3 or the control IC 12.

Further, according to the above-described configuration, since the control IC 12 and the switching element 3 are integrated into one component, the number of components can be reduced. Furthermore, since there is no need to provide a wire 163 (see FIG. 9) for connecting the control IC 12 and the switching element 3, the manufacturing cost of the igniter 16 can be reduced. Since connection pads 168 (see FIG. 9) in the control IC 12 and the switching element 3 are not required, the chip area can be reduced, and therefore the igniter 16 can be downsized. Thus, a further effect of reducing the size of the ignition device 1 can be provided.

Although the temperature sensor 4 is provided in the switching element 3 in this embodiment, the present invention is not limited to this, and the temperature sensor 4 may be provided in the control IC. In addition, the thermal cutout circuit 5 may be formed in the switching element 3.

Sixth Embodiment

Figure 19:
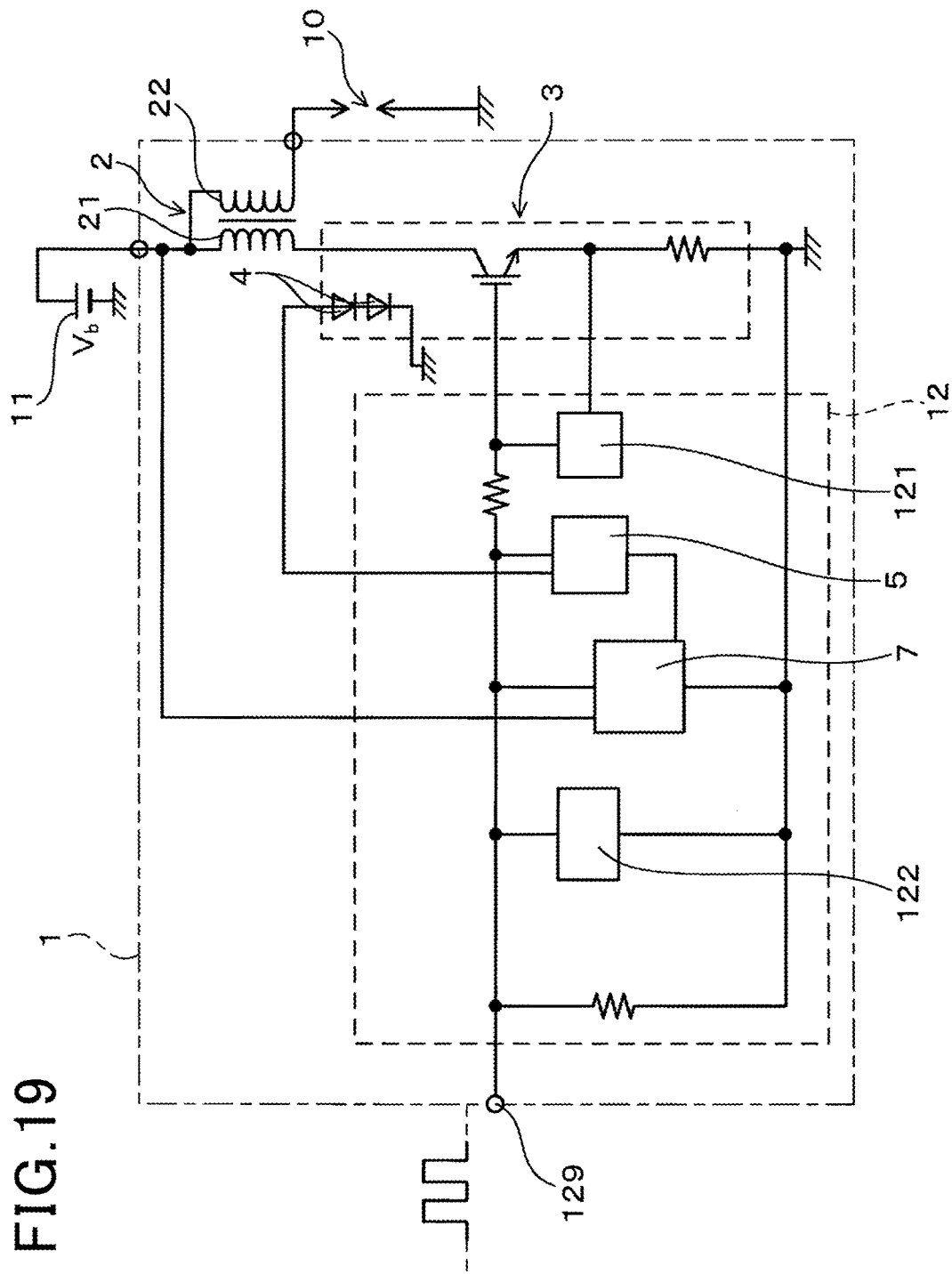
FIG. 19 is a circuit diagram of the ignition device in the sixth embodiment.

This embodiment is an example in which the circuit configuration of the control IC 12 is changed. As shown in FIG. 19, also in this embodiment, the temperature sensor 4 is formed in the switching element 3, and the thermal cutout circuit 5 and the reference voltage shift circuit 7 are formed in the control IC 12.

Further, in this embodiment, in addition to the thermal cutout circuit 5 and the reference voltage shift circuit 7, a current limiting circuit 121 and an operation level setting circuit 122 are formed in the control IC 12. An ignition signal is input from the ECU (not shown) to the input terminal 129 of the control IC 12. In this embodiment, unlike the first embodiment, the control IC 12 is not driven by the power from the DC power supply 11. In this embodiment, the ignition signal is used as the power source of the control IC 12. The ignition signal not only turns on the switching element 3 when it becomes H and is applied thereto, but also allows components such as the thermal cutout circuit 5 to operated using the voltage of the ignition signal itself. Thus, a further effect of reducing the size of the ignition device 1 can be provided.

Seventh Embodiment

Figure 20:
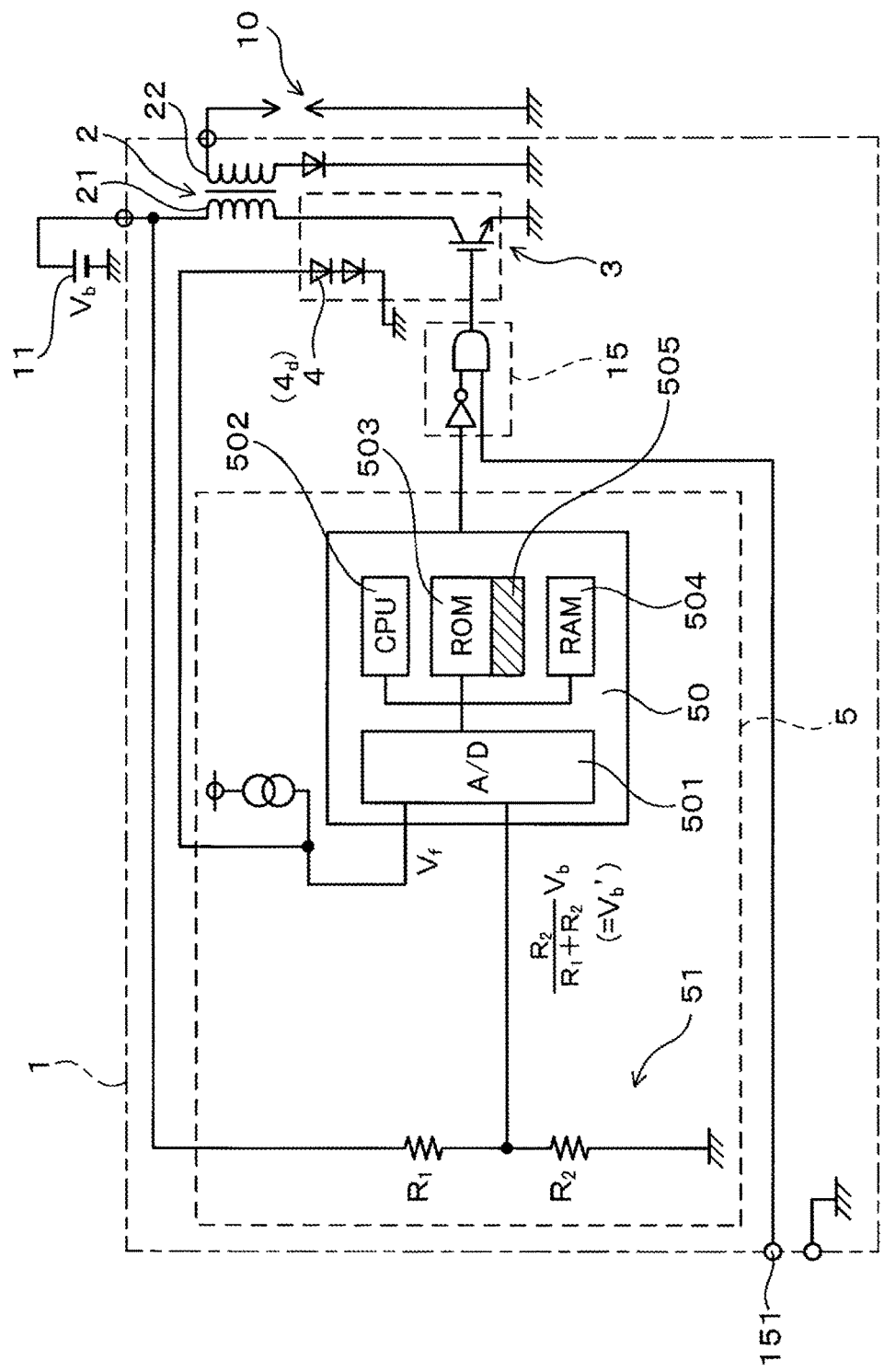
FIG. 20 is a circuit diagram of the ignition device in the seventh embodiment.

This embodiment is an example in which the configuration of the thermal cutout circuit 5 is changed. As shown in FIG. 20, the thermal cutout circuit 5 of this embodiment includes a digital control unit 50 and a voltage dividing circuit 51. The digital control unit 50 includes an A/D converter 501, a CPU 502, ROM 503, and RAM 504. A control program 505 is stored in the ROM 503. The CPU 502 reads and executes the program 505. The forcible turn-off temperature Toff is thereby controlled.

The A/D converter 501 converts the divided voltage Vb' of the power supply voltage Vb divided by the voltage dividing circuit 51, and the forward voltage Vf of the diode 4d into digital values. The CPU 502 calculates the temperature of the switching element 3 using the forward voltage Vf. The CPU 502 also makes the forcible turn-off temperature Toff lower when the power supply voltage Vb decreases.

In addition, this embodiment has a similar configuration, and similar functions and effects as those of the first embodiment.

What is claimed is:

1. An ignition device for igniting a spark plug, comprising:

an ignition coil having a primary winding connected to a DC power supply, and a secondary winding connected to the spark plug;

a switching element connected to an end of the primary winding that is opposite from an end connected to the DC power supply;

a temperature sensor for measuring the temperature of the switching element; and a thermal cutout circuit configured to forcibly turn off the switching element when the temperature of the switching element becomes higher than a predetermined forcible turn-off temperature, wherein the thermal cutout circuit is further configured to lower the forcible turn-off temperature as a function of a power supply voltage when the power supply voltage of the DC power supply decreases.

2. The ignition device according to claim 1, wherein the temperature sensor is a diode, and the thermal cutout circuit includes a comparator configured to compare a forward voltage of the diode with a reference voltage, and forcibly turn off the switching element when the forward voltage is lower than the reference voltage, and a reference voltage shift circuit configured to lower the forcible turn-off temperature by raising the reference voltage when the power supply voltage decreases.

3. The ignition device according to claim 1, wherein the temperature sensor is provided in the switching element.

4. The ignition device according to claim 1, wherein the thermal cutout circuit is formed in a control IC for controlling the operation of the switching element, the control IC is placed adjacent to the switching element, and the temperature sensor is provided in the control IC.

5. The ignition device according to claim 1, wherein the thermal cutout circuit is formed in a control IC for controlling the operation of the switching element, the control IC and the switching element is integrated into a single semiconductor chip, and the temperature sensor is provided in the control IC or the switching element.

6. The ignition device according to claim 1, wherein the thermal cutout circuit is further configured to lower the forcible turn-off temperature stepwise as the power supply voltage decreases.

7. The ignition device according to claim 1, wherein the thermal cutout circuit is further configured to lower the forcible turn-off temperature continuously as the power supply voltage decreases.

* * * * *